United States Patent
Yang et al.

(10) Patent No.: US 6,649,437 B1
(45) Date of Patent: Nov. 18, 2003

(54) METHOD OF MANUFACTURING HIGH-POWER LIGHT EMITTING DIODES

(75) Inventors: Kuang-Neng Yang, Ping-Chen (TW); Chih-Sung Chang, Hsinchu (TW); Tzer-Perng Chen, Hsinchu (TW)

(73) Assignee: United Epitaxy Company, Ltd., Hsinchu (TW)

( * ) Notice: Subject to any disclaimer, the term of this patent is extended or adjusted under 35 U.S.C. 154(b) by 0 days.

(21) Appl. No.: 10/224,980

(22) Filed: Aug. 20, 2002

(51) Int. Cl.⁷ .............................................. H01L 21/00
(52) U.S. Cl. ............................ 438/30; 438/22; 257/98; 349/113
(58) Field of Search .......................... 438/22, 27, 29, 438/30; 257/79, 81, 82, 91, 98, 99; 349/113, 114, 115, 122, 142

(56) References Cited

U.S. PATENT DOCUMENTS

| | | | |
|---|---|---|---|
| 3,869,637 A | * | 3/1975 | Usui .......................... 313/500 |
| 5,103,271 A | * | 4/1992 | Izumiya et al. ............... 357/17 |
| 5,185,288 A | | 2/1993 | Cook et al. |
| 5,376,580 A | | 12/1994 | Kish et al. |
| 5,793,062 A | * | 8/1998 | Kish, Jr. et al. ............... 257/98 |
| 5,828,088 A | * | 10/1998 | Mauk .......................... 257/98 |
| 5,917,202 A | * | 6/1999 | Haitz et al. ................... 257/98 |
| 6,107,648 A | * | 8/2000 | Shakuda et al. ............. 257/103 |
| 6,222,207 B1 | * | 4/2001 | Carter-Coman et al. ....... 257/98 |
| 6,319,778 B1 | | 11/2001 | Chen et al. .................. 438/273 |
| 6,365,951 B1 | * | 4/2002 | Workley ...................... 257/438 |
| 6,462,358 B1 | * | 10/2002 | Lin et al. ...................... 257/99 |
| 6,469,324 B1 | * | 10/2002 | Wang .......................... 257/98 |
| 6,480,389 B1 | * | 11/2002 | Shie et al. ................... 361/707 |
| 2001/0042866 A1 | | 11/2001 | Coman et al. .............. 257/103 |

* cited by examiner

*Primary Examiner*—Matthew Smith
*Assistant Examiner*—Renzo N Rocchegiani

(57) ABSTRACT

The present invention is related to a method of manufacturing high efficiency LEDs. The LEDs uses a metal reflection layer to solve the problem of light absorption by the substrate, and improves the illumination. It also forms a vertical structure where the P and N ends are on the top and bottom sides of the LEDs, respectively. A vertical structure is easier for final packaging. In addition, the present invention uses a metal substrate to replace the semiconductor substrate in order to improve the heat dissipation, and enable the LEDs to operate at a higher current.

4 Claims, 2 Drawing Sheets

METHOD OF MANUFACTURING HIGH-POWER LIGHT EMITTING DIODES

FIELD OF THE INVENTION

This invention relates to the field of electro-optical devices, and more particularly to a method for manufacturing high efficiency light emitting diodes (LED).

BACKGROUND OF THE INVENTION

Most high illumination, high efficiency light emitting diodes (LED) in use today are AlGaAs infra emitting diodes (IRED), red LEDs, AlGaInP red, orange, yellow, green-yellow LEDs, or AlGaInN blue and green LEDs. AlGaAs and AlGaInP LEDs are fabricated on a GaAs substrate, which absorbs more than half of the light emitted from the emitting layer. This is considered energy inefficient for most practical applications. To improve the power efficiency, most AlGaAs-based LEDs grow a thick AlGaAs epitaxial layer with energy bandgap larger than the light-emitting layer, as discloed in U.S. Pat. No. 5,185,288. The epitaxial layer is used as a transparent substrate, and the light-absorbing GaAs substrate is removed. However, in this method, it takes a much longer time to grow the AlGaAs transparent substrate, and hence higher fabrication cost. Furthermore, because the crystal grid and heat expansion coefficients of the AlGaAs and GaAs arc different, the grown epitaxial layer usually suffers sever warpage and deformation. Consequently, the following fabrication of LEDs is more difficult. In addition, the AlGaAs substrate, as similar to the GaAs substrata, is not good in heat dissipation and, hence, unsuitable for high current opertion.

The AlGaInP LEDs, as disclosed in U.S. Pat. No. 5,376,580, use the method of direct wafer bonding to form the transparent substrate. However, the method removes the GaAs substrate before the bonding the AlGaInP epitaxial layer to another transparent GaP substrate. Because the AlGaInP epitaxial layer, after removing the GaAs substrate, is only about 50 um in thickness, it is easier to break during the wafer bonding process and, hence, the yield rate is decreased. In addition, the heat dissipation in a GaP substrate, although slightly better than in a GaAs substrate, is still far below metals, such as Al or Cu. Therefore, the LEDs manufactured with this method can not operate at a high current.

U.S. Pat. No. 6,319,778 B1 discloses another method of manufacturing LEDs. It uses a metal with a high conductivity and a high reflection coefficient to avoid the light absorption by the substrate. Because the bonding process is conducted at A low temperature, the solder layer can be fused into the liquid state to achieve a better soldering. In addition, the industrial standard requires the vertical structured LEDs to provide a single wire bonding to lower the packaging cost. Because of the better heat dissipation capability, the LEDs manufactured with this method can operate at a higher current.

U.S. Pat. No. 2001/0,042,866 A1 discloses method of metal bonding for manufacturing the high illumination AlGaInN LEDs. It uses a metal reflection layer to reflect the emitted light, to avoid the light absorption by the substrate. The metal bonding layer bonds the epitaxial layer to a substrate with a good heat dissipation capability, such as Si, and a metal substrate to improve the heat dissipation. However, for a good yield rate with this method, both the surfaces of the heat dissipation substrate and the LED epitaxial layer must be smooth before the bonding. As the LED epitaxial layer is usually warped, and contains small bumps at the surface, it is difficult to achieve a good bonding between the two.

The present invention solves the problem of light absorption by the substrate, improves the heat dissipation, and can transport the LED epitaxial layer from the poor heat dissipation substrate to the good heat dissipation metal layer even when the LED epitaxial layer is warped or has a rough surface.

SUMMARY OF THE INVENTION

The present invention is related to a method of manufacturing high efficiency LEDs. The LED uses a metal reflection layer to solve the problem of light absorption by the substrate, and improves the illumination. To avoid the interaction between the metal reflection layer and the upper cladding layer of the LED, a diffusion barrier layer is used between them to prevent their interaction. It also forms a vertical structure where the P and N ends are on the top and bottom sides of the LEDs, respectively. A vertical structure is easier for final packaging. In addition, the present invention uses a metal substrate to replace the semiconductor substrate in order to improve the heat dissipation, and enable the LEDs to operate at a higher current.

The present invention will become more obvious from the following description when taken in connection with the accompanying drawings which show, for purposes of illustration only, a preferred embodiment in accordance with the present invention.

DETAILED DESCRIPTION OF THE INVENTION

Figure 1:
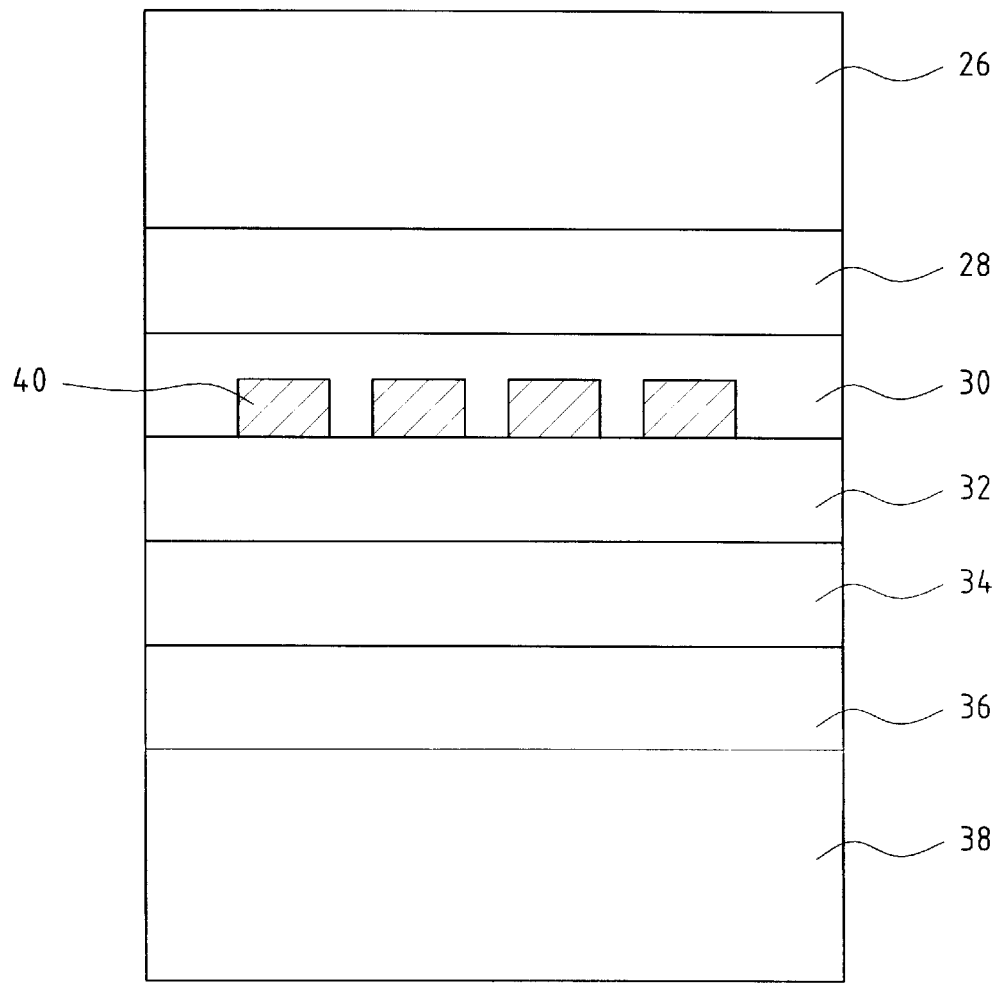
FIG. 1 shows the present invention in the embodiment of AlGaAs LED epitaxial structure.

FIG. 1 shows the first embodiment of present invention, an AlGaAs red LED. To reduce the manufacturing cost, the present invention can start with the off-the-shelf liquid phase, 660 um AlGaAs double heterostructured (DH) red LED epitaxy. As shown in FIG. 1, the structure includes a P-type GaAs substrate 38, and a series of device layers grown on top of the substrate 38. The double hetero structure includes a P-type AlGaAs lower cladding layer 36, whose Al concentration is about 70–80% a P-type AlGaAs active layer 34 with 35% Al concentration, and an N-type AlGaAs upper cladding layer 32. Part of the upper cladding layer 32 is coated with an Ohmic contact metal 40. Because the Ohmic contact metal 40 absorbs light, its size should be small to avoid a large light blocking area On the other hand, its size should be large enough to avoid a high contact resistance. Then, a metal reflection layer 28 is used to reflect the light emitted from the active layer 34 before it is absorbed by the metal substrate layer 26. The metal reflection layer 28 should have a reflection rate higher than 80% to effectively reflect the light cmitted from the active layer 34, For visible lights, metals such as silver, aluminum, and gold all have high reflection rate are suitable candidate material for the metal reflection layer 28. To avoid the interaction between the metal reflection layer 28 and the N-type AlGaAs upper cladding layer 32, a diffusion barrier layer 30 is used between them to prevent their interaction. The diffusion barrier layer 30 can be made of a high temperature metal layer, such as W and Mo, or a transparent conductive layer, such as ITO, ZnO. The diffusion barrier layer 30 made of a high temperature metal layer should not be too thick. Otherwise, it absorbs too much light. Then, a thicker layer of metal is electroplated to form the metal substrate layer 26. The purpose of the metal substrate layer 26 is to support the LED epitaxial layer, and dissipate the heat generated by the LED. It can be made of metals with high heat conductivity, such as Al and Cu.

Figure 2:
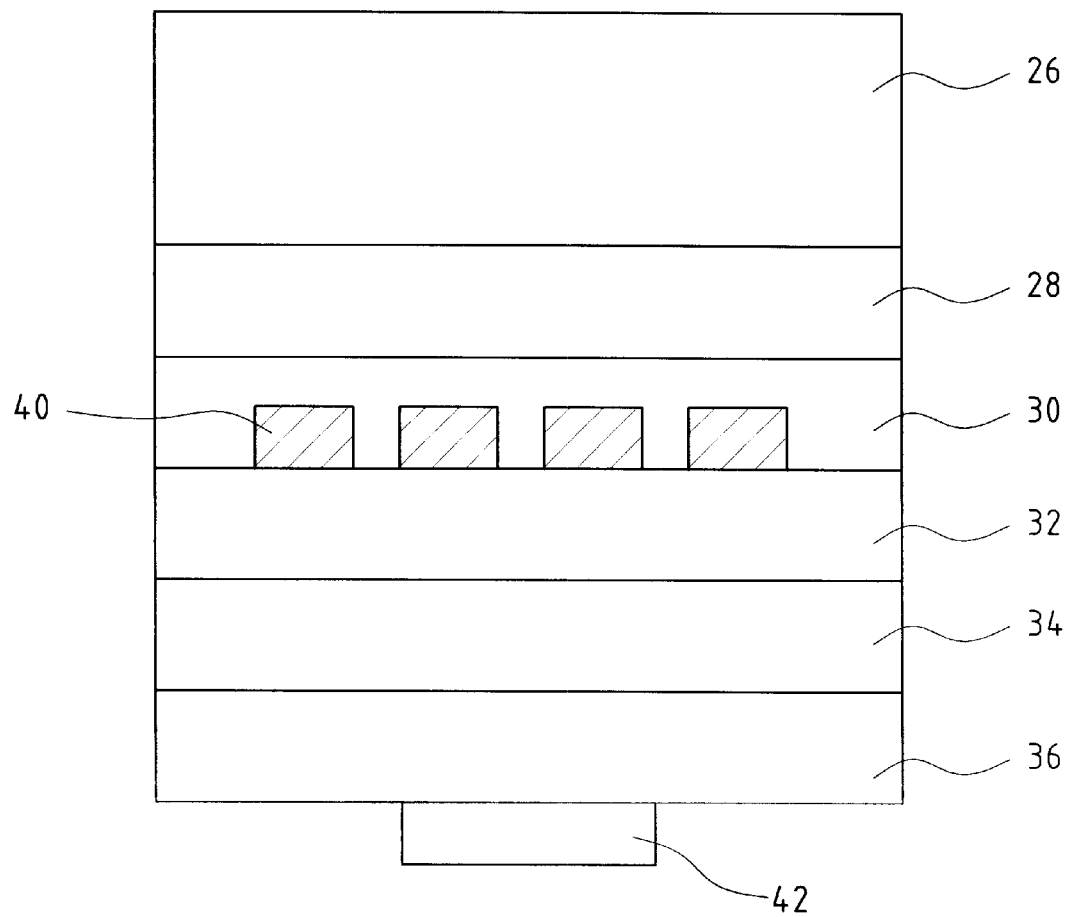
FIG. 2 shows the present invention in the embodiment of AlGaAs LED epitaxial structure after removing the GaAs substrate.

FIG. 2 shows the present invention in the embodiment of AlGaAs LED epitaxial structure after removing the P-type GaAs substrate. After the metal substrate layer 26 is electorplated, the P-type GaAs substrate 38 is removed by etching, either wet etching or dry etching. Then, part of the P-type lower cladding layer 36 is electroplated with a P-type Ohmic contact metal 42. The epitaxy is cut into small chips by a cutting machine to form a P on the top side and an N on the bottom side. This vertically structured LED chip is without the light absorption substrate, and with good heat dissipation capability.

Conventional 660 um AlGaAs double heterostructured (DH) red LED epitaxy sold off-the-shelf usually is warped and with a rippled or terraced surface. Hence, it is difficult to bond the LED epitaxy to the high heat conductivity substrate using the conventional bonding technologies, such as direct wafer bonding, or metal bonding. The present invention uses electroplating to form the metal substrate for heat dissipation, and avoids the bonding problems that the prior arts are unable to solve.

While we have shown and described the embodiment in accordance with the present invention, it should be clear to those skilled in the art that further embodiments may be made without departing from the scope of the present invention.

What is claimed is:

1. A method of manufacturing high efficiency light emitting diodes, comprising the steps of:

preparing a light emitting double hetero structure formed on a device substrate, said double hetero structure having an upper cladding layer, an active layer and a lower cladding layer stacked on said device substrate;

coating a plurality of ohmic metal contacts on said upper cladding layer;

covering said plurality of ohmic metal contacts and said upper cladding layer with a diffusion barrier layer;

forming a metal reflection layer on said diffusion barrier layer.

electroplating a metal substrate layer on said metal reflection layer;

removing said device substrate to expose said lower cladding layer; and forming at least one ohmic contact electrode on said lower cladding layer.

2. The method of manufacturing high efficiency light emitting diodes as claimed in claim 1, wherein said metal reflection layer comprises a material selected from the group of Au, Al, and Ag.

3. The method of manufacturing high efficiency light emitting diodes as claimed in claim 1, wherein said metal substrate layer comprises a material selected from the group of Al and Cu.

4. The method of manufacturing high efficiency light emitting diodes as claimed in claim 1, wherein said diffusion barrier layer comprises a material selected from the group of W, Mo, ITO and ZnO.

* * * * *